United States Patent [19]

Farina

[11] 4,156,834

[45] May 29, 1979

[54] CIRCUIT ARRANGEMENT FOR PROVIDING A SAW-TOOTH CURRENT IN A COIL

[75] Inventor: Attilio Farina, Turin, Italy

[73] Assignee: Indesit S.p.A., Turin, Italy

[21] Appl. No.: 770,114

[22] Filed: Feb. 18, 1977

[30] Foreign Application Priority Data

Feb. 26, 1976 [IT] Italy ............................. 67438 A/76

[51] Int. Cl.² ............................................. H01J 29/70
[52] U.S. Cl. .................................... 315/411; 315/408
[58] Field of Search ................. 315/408, 410, 411, 399

[56] References Cited

U.S. PATENT DOCUMENTS

| 3,195,009 | 6/1965 | Poorter | 315/408 |
| 3,638,067 | 1/1972 | Dietz | 315/408 |
| 3,889,156 | 6/1975 | Arya | 315/408 |

Primary Examiner—Theodore M. Blum
Attorney, Agent, or Firm—Allison C. Collard; Thomas M. Galgano

[57] ABSTRACT

In a circuit arrangement for providing a periodic saw-tooth current in a coil, e.g. a kinescope deflector coil, comprising a one-way conducting device that connects the coil to a voltage source, and a controllable switching device having a control electrode connectable to a periodic pilot-pulse source that makes the switching device conductive during part of the saw-tooth cycle, the switching device being connectable to a current source through an induction coil, the improvement wherein the latter is serially connected with the switching device, both being connected to the voltage source; and wherein a point common to the induction coil and to the switching device is connected through a capacitor to a transformer which latter is in turn connected to the one-way conducting device.

5 Claims, 1 Drawing Figure

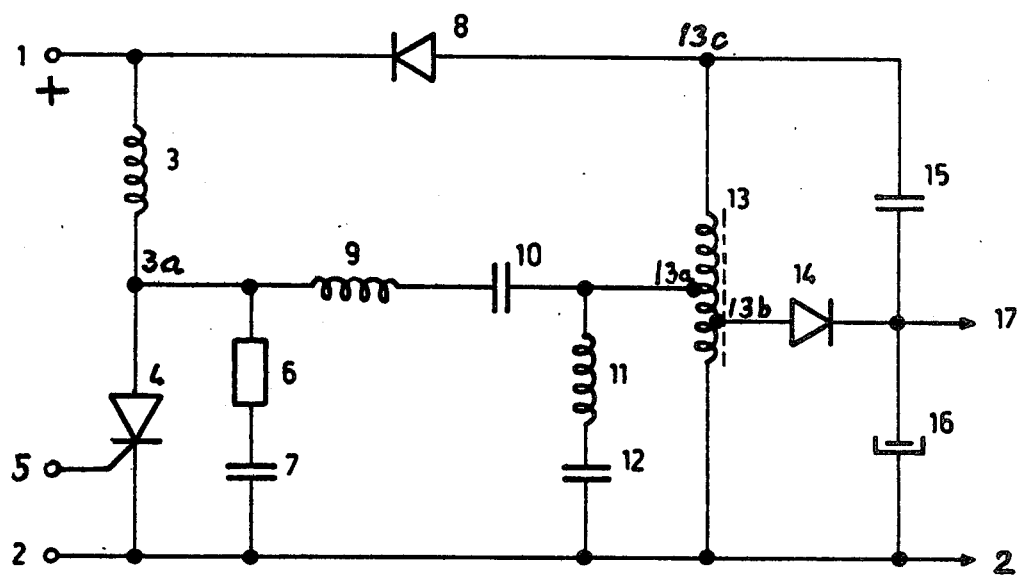

CIRCUIT ARRANGEMENT FOR PROVIDING A SAW-TOOTH CURRENT IN A COIL

The present invention relates to a circuit arrangement designed to provide a periodic saw-tooth current in a coil, particularly a kinescope deflector coil. In basic aspects of such arrangements, there is a one-way conducting device connecting the coil to a voltage source, and a controllable switching device, with its control electrode connected to a periodic pilot-pulse source that makes the switch conductive during part of the saw-tooth cycle, connectable to a current spply by means of an inductance. A number of semiconductor arrangements similar to the one described are already known.

The first arrangement of its type to be known which made use of a thyristor and a diode was that described in an article by S. A. Schwartz and L. L. Ornik in the IEEE Transactions on BTR, November 1963, No. 3, pages 9 to 22. This arrangement has a number of drawbacks so much so that it has not been put into practical use.

Just two should be mentioned as examples: 1/ either the thyristor or the transformer has to be ground insulated; and 2/ the conduction time of the thyristor is too short, with the result that its current peak is extremely high.

An arrangement is described in German Pat. No. 1,283,273 which overcomes these drawbacks but operates at a very low voltage which makes it impractical. A modified version of this circuit is described in Italian Pat. No. 774,949; this operates at much higher voltages (though still not high enough for use in Europe where mains voltages are conventionally 220 V) but it has two serious defects: a large part of the absorbed current has to be forcibly dissipated, and the thyristor has to be ground insulated.

Other thyristor circuits perfected later to overcome these defects are much more complex (for example the circuits described in Italian Pat. Nos. 812,759, 867,583 and 901,666, which latter is composed of two thyristors, two diodes and a number of passive components).

The object of the present invention is to provide a thyristor circuit arrangement that overcomes the inconveniences described above.

A further object of the invention is to provide a circuit arrangement which, in addition to providing the saw-tooth current, enables auxiliary circuits to be supplied at any required voltage without overloading the active elements.

With these objects in view, the present invention relates to a circuit arrangement for providing a periodic saw-tooth current in a coil, particularly a kinescope deflector coil, composed of a (first) one-way conducting device connecting the coil to a voltage source, and a (second) controllable switching device, with its control electrode connected to a periodic pilot-pulse source which makes the switching device conductive during part of the saw-tooth cycle, connected to a current source through a (first) induction coil.

According to important features of the invention, the induction coil and the switching device, interconnected in series, are both connected to the voltage-supply terminals, and a point common to the switching device and the induction coil is connected, through a capacitor, to a transformer which is itself connected to the one-way conducting device.

Further objects, features and advantages of the inventive circuit arrangement, preferably including a thyristor, will become better understood by reference to the following description, when taken in conjunction with the sole FIGURE of the accompanying drawing, showing the circuit diagram of an exemplary, preferred arrangement according to the invention.

Before describing the circuit arrangement, reference should be had to a concurrently filed patent application Ser. No. 770,115 of the undersigned, with an identical title, which relates to a similar but not identical circuit arrangement that provides a periodic saw-tooth current, for example for a kinescope deflector coil. Almost exclusively identical reference numerals have been used in the two closely related applications, to cover identical circuit elements or those having similar functions, except where additional elements are involved that are not part of the other circuit arrangement.

In the FIGURE of this application, two DC supply terminals marked with numerals 1, 2 are shown. The voltage applied to the terminal 1 is positive with respect to that applied to the terminal 2. Terminal 1 is connected to an induction coil 3 and to the cathode of a diode 8. The other induction coil terminal is connected at a point 3a to the anode of a thyristor 4 or the like controllable electronic switching device, to a resistor 6 and to a second induction coil 9. By way of comparison it might be added at this point that the function of coil 9 is taken over in the above-mentioned related application by leakage inductance in a transformer 13 of that case (similar to but not identical with that to be described hereunder).

The cathode of thyristor 4 is connected to the terminal 2. A control electrode 5 of the thyristor is taken as being supplied with sufficient positive control pulses lasting a few microseconds and recurring about 64 microseconds apart. These pulses are derived from an extraneous periodic pilot-pulse source.

The other terminal of resistor 6 is connected through a capacitor 7 to the terminal 2. The anode of diode 8 is connected by way of a point 13c to an autotransformer 13, eventually leading to the terminal 2, which transformer has two intermediate taps, numbered 13a and 13b, to be described in more detail.

To the first tap 13a is connected one terminal of a capacitor 10, the other terminal being connected to the induction coil 9, and of a deflector coil 11 (that of a kinescope) which is connected by its other terminal to the terminal 2 by way of a capacitor 12.

To the second tap 13b of transformer 13 is connected the anode of a diode 14, the cathode of which is connected to respective terminals of a capacitor 15, of a capacitor 16 (preferably electrolytic), and to an output terminal 17 to be explained later.

The other terminal of capacitor 15 is connected to the anode of diode 8, while the other terminal of capacitor 16 is connected to the terminal 2 where it constitutes another output terminal (ground), to be used in conjunction with terminal 17.

The circuit in question operates as follows. The moment control electrode 5 of thyristor 4 receives a start pulse, the armature of capacitor 10, connected to induction coil 9, is charged with a positive voltage several times greater than the supply voltage applied to the terminal 1.

The thyristor 4 becomes conductive and capacitor 10 is discharged through induction coil 9 and the circuit formed by deflector coil 11, capacitor 12 and the transformer section between the lower end in the FIGURE (leading to the terminal 2) and tap 13a.

The discharge current curve is more or less sinusoidal, rising to a peak, after which it begins to drop. This first part of the phenomenon in caused mainly by the charge of capacitor 15 which can be taken as being transferred by transformer 13 to the terminals of the series circuit formed by the elements 11, 12. As capacitor 12 and transformer induction coil (part of 13) are much greater than capacitor 15 and the inductance of coil 11, respectively, the parallel resonance circuit is connected in series to capacitor 10, formed by capacitor 15 that is referred to the primary transformer section and deflector coil 11.

When capacitor 15 is charged, let us say, 6 microseconds after capacitor 10 starts discharging, it will start discharging again, that is to say, the voltage at its upper armature (as shown in the drawing), having reached the maximum negative level, starts to rise in the positive direction.

At one point, the voltage of capacitor 15 is higher than the supply voltage applied to the terminal 1, which makes diode 8 conductive. The result is that a large-output capacitor (not shown) of the supply unit is made parallel to capacitor 15 through transformer 13 and is even applied to the terminals of the series circuit 11, 12. This produces a linear current in coil 11 (trace interval of the saw-tooth cycle).

Thyristor 4 continues conducting after diode 8 has become conductive. Its current, which had risen after touching the minimum, reaches a second maximum, after which it drops again to zero owing to capacitor 10 being discharged.

At this point, the voltage at the thyristor terminals is inverted. Thyristor 4 is disabled and capacitor 10 starts recharging through induction coils 3, 9. In the meantime, diode 8 carries on conducting until all the power transferred to circuit 11, 15 by capacitor 10 discharging is used up.

By establishing a suitable value for the ratio of autotransformer 13 and for the time constant of elements 9, 10 (which determines the conduction time of the thyristor), diode 8 can be kept conductive throughout the time necessary for the trace interval of the saw-tooth cycle.

Capacitor 7 and resistor 6 form a damping circuit for the parasitic oscillations of induction coil 9.

To minimize circuit losses, it has been found better for induction coil 9 to be smaller, and induction coil 3 to be bigger than the value of deflector coil 11.

Diode 14, which is not indispensable for the operation of the circuit arrangement, is used to supply the terminals 2, 17 with a continuous voltage between zero and the voltage level supplied to the terminal 1, depending to which autotransformer tap it is connected.

The terminals 2, 17 therefore can be loaded, that is, low-voltage auxiliary circuits can be supplied. This load does not lead to an increase in thyristor current as long as the required power level does not exceed the power returned to the supply unit by diode 8. In other words, the current supplied to load 2, 17 is taken away from that of diode 8.

The extra high voltage for the kinescope accelerator anode can be obtained by means of peak-to-peak rectification or by multiplying, usually with known diode circuits and capacitors, the voltage peak at the anode of diode 8 or a higher peak obtained by lengthening the winding of autotransformer 13 until the required level is reached.

Alternatively, extra high voltage can be obtained by means of a booster winding (not shown) connected to induction coil 3 as proposed by L. Szanto (of the Popow Research Institute of Prague, Czechoslovakia), in his article "A Retrace Driven Television Horizontal Deflection Circuit", IEEE Transactions on BTR, April 1966, pp. 51 to 64.

In the following, the values of the various electronic components are indicated that have been used successfully in an experimental version of the described circuit arrangement:

| | | |
|---|---|---|
| Induction coil | 3 | 3.6 mH |
| Resistor | 6 | 1 kΩ |
| Capacitor | 7 | 500 pF |
| Induction coil | 9 | 0.15 mH |
| Capacitor 10 | 10 | 0.15 μF |
| Deflector coil | 11 | 0.3 mH |
| Capacitor | 12 | 1.8 μF |
| Autotransformer having taps | 13 13a, 13b at | 0.42 and 0.2 of the whole |
| Capacitor | 15 | 12 nF |
| Capacitor (e'lytic) | 16 | 100 μF |

With a supply voltage of 185 V at the terminals 1, 2, roughly 12 App was obtained in coil 11, and 36 V at the terminals 2, 17, from which 5 A can be obtained without trouble.

The maximum current in thyristor 4 was roughly 12 A, with 6 A in diode 8 when the terminals 2, 17 are in the no-load condition. The inverse voltage on diode 8 was roughly 1500 V peak.

The supply voltage required at the terminal 1 can be adjusted by varying the ratio of autotransformer 13 and, consequently, the values of induction coil 9 and capacitor 10, to obtain correct conduction in diode 8.

The advantages of the circuit arrangement according to this invention will be clearly seen and understood from the description. To those skilled in the art, it will be clear that variations, substitutions, modifications and changes can be made to the described circuit without, however, departing from the spirit and scope of the present invention.

It should also be understood that the concurrently filed application of the same inventor, U.S. application Ser. No. 770,115, filed Feb. 18, 1977, should be considered as supplementing the present disclosure, if necessary in respect of some detail, possibly not expounded or fully explained in the present case (with different words) as in the other, companion application.

What I claim is:

1. A circuit arrangement for providing a periodic saw-tooth current in a coil, such as a kinescope deflector coil (11), comprising:
   a one-way conducting device (8) having one end immediately coupled to a pole (1) of a voltage source (1, 2) and the other end coupled to the coil;
   a controllable switching device (4) having one end connected to the other pole (2) of said voltage source (1, 2) and having a control electrode (5) which may be coupled to an extraneous periodic pilot-pulse source which makes said switching device conductive during part of the saw-tooth cycle;
   an induction coil (3) having one end connected to said one pole (1) of said voltage source (1, 2) and the other end connected to the other end of said controllable switching device;

one capacitor (10) having one end connected to said other end of said induction coil (3);

a transformer (13) connected both to said other end of said capacitor and to said other end of said one-way conducting device (8);

a further one-way conducting device (14) connected to said transformer (13) charging a further capacitor (16) for supplying (2, 17) at least one auxiliary circuit with a voltage different from that of said voltage source (1, 2);

said one-way conductive device (8) being substantially the only way for said saw-tooth current flowing through said coil (11) to flow back in said voltage source (1, 2) so that said one-way conductive device (8) is made conductive through all the trace interval of the saw-tooth by said saw-tooth current;

said further one-way conducting device (14) being connected to said transformer (13) with such polarity that the current supplied to the auxiliary circuit is taken away from that flowing through said one-way conductive device (8).

2. The circuit arrangement as defined in claim 1, wherein said transformer is an autotransformer (13).

3. The circuit arrangement as defined in claim 2 further comprising capacitance means (15) connected between a point (13c) common to said one-way conducting device (8) and to said transformer (13) and a terminal (17) of said further capacitor (16).

4. The circuit arrangement as defined in claim 1 further comprising a resistor (6) and a capacitor (7) to form a transient suppressing network connected in parallel to said switching device (4) and to said other end of said controllable switching device.

5. The circuit arrangement as defined in claim 1 further comprising an other induction coil (9) connected in series with said one capacitor (10), wherein said switching device is a thyristor (4) and said other induction coil (9) and said one capacitor (10) form a time constant sufficiently great to keep the thyristor (4) conductive throughout the retrace interval of the saw-tooth cycle and for a first part of the trace interval.

* * * * *